United States Patent [19]

Boys et al.

[11] Patent Number: 4,500,407
[45] Date of Patent: Feb. 19, 1985

[54] DISK OR WAFER HANDLING AND COATING SYSTEM

[75] Inventors: Donald R. Boys, Cupertino; Walter E. Graves, San Jose, both of Calif.

[73] Assignee: Varian Associates, Inc., Palo Alto, Calif.

[21] Appl. No.: 515,247

[22] Filed: Jul. 19, 1983

[51] Int. Cl.³ .............................................. C23C 15/00
[52] U.S. Cl. ..................... 204/298; 118/50; 118/724; 198/339; 198/345; 204/192 R; 294/99 R; 414/217; 414/222; 424/225; 414/416; 414/417
[58] Field of Search ............. 204/298, 192 R; 118/50, 118/724; 198/339, 345; 294/99 R; 414/217, 225, 222, 416, 417

[56] References Cited
U.S. PATENT DOCUMENTS

| 2,975,753 | 3/1961 | Hayes . | |
| 3,340,176 | 9/1967 | Belluso et al. | 204/298 |
| 3,521,765 | 7/1970 | Kauffman et al. . | |
| 3,717,119 | 2/1973 | Boys et al. . | |
| 3,856,654 | 12/1974 | George | 204/192 R |
| 3,874,525 | 4/1975 | Hassan et al. . | |
| 3,915,117 | 10/1975 | Schertler . | |
| 3,973,665 | 8/1976 | Giammanco . | |
| 3,981,791 | 9/1976 | Rosvold . | |
| 4,183,797 | 1/1980 | Kennedy et al. . | |
| 4,311,427 | 1/1982 | Coad et al. | 414/225 |

OTHER PUBLICATIONS

D. R. Rogalla, "Coating Magnetic Storage Disks" vol. 11 No. 11 Apr. 1969, p. 1611.
T. C. Tiscone, "Low Voltage Triode Sputtering with a Confined Plasma" Dec. 1975/Solid State Technology pp. 34–40.

Primary Examiner—Arthur P. Demers
Attorney, Agent, or Firm—Stanley Z. Cole; Leon F. Herbert

[57] ABSTRACT

A system for handling and individually processing a plurality of thin substrates is described. The system includes a main chamber, entrance and exit load locks, a plurality of processing stations, a load lock load/unload means, a vertical transport means, and a horizontal transport means. In one embodiment the processing stations are deployed in a U-shaped configuration, allowing the entrance and exit load locks to be positioned at the same end of the machine. Idle stations between processing stations may also be employed. The substrates are vertically oriented and are raised and lowered into and out of load locks and processing stations by means of dedicated lift blades. Substrates are transferred within the main chamber from lift blades of one station to lift blades of an adjacent station by means of substrate carriers affixed to a walking beam mechanism. Substrates are transferred from the entrance load lock side of the machine to the exit load lock side by means of a reversing mechanism, which may be a rotating beam mechanism, or which may be a transverse motion mechanism which affects a rotationless substrate transfer. A lift blade symmetrically engages a substrate nearer the lower half of its periphery, holding the substrate securely with the aid of gravity, and negligibly obscuring or eclipsing either surface of the substrate.

The lift blades carry the substrates into the processing stations and hold them in place during processing, or simultaneous processing of both sides of the substrates may be carried out.

43 Claims, 10 Drawing Figures

DISK OR WAFER HANDLING AND COATING SYSTEM

FIELD OF THE INVENTION

This invention is in the field of vacuum coating apparatus and particularly relates to coating with both magnetic and nonmagnetic materials using magnetron sputter coating sources.

BACKGROUND OF THE INVENTION

The handling and coating system described herein comprises a vacuum system, a transport system, and a plurality of processing stations. Also included, but not herein described, are various power supplies, water cooling means, gas handling means, and control systems.

It has become increasingly important to handle and transport on an individual basis thin substrates, such as semiconductor wafers and substrates for magnetic disks, from a cassette into, through, and out of a vacuum coating system and back into a cassette. Some recent developments in such systems are described in U.S. Pat. No. 4,311,427, "Wafer Transfer System" issued Jan. 19, 1982 to G. L. Coad, R. H. Shaw and M. A. Hutchinson, and assigned to the assignee of the present invention.

The above-referenced system has performed extremely well in important semiconductor wafer coating applications. With the emerging need for similar systems for processing and coating magnetic disk substrates, now of vital interest in computer memory applications, it has become apparent that certain modifications in various aspects of the system are needed for magnetic disk manufacture. Once effectively implemented, some of these modifications may be of benefit in semiconductor wafer processing as well.

One feature of the above-referenced system (U.S. Pat. No. 4,311,427) is that the thin substrates are held "on edge" in a vertical orientation, and are processed individually. Although both sides of the substrates are accessible for processing, only one side of the semiconductor wafer need be coated, with heating or cooling means being optionally applied to the back side of the wafer, for example. In the coating of magnetic disks, it is necessary to coat both sides of the substrate, and it is highly desirable to coat both sides simultaneously. A more symmetrical means of supporting the individual substrates during coating is therefore needed.

In some coating systems, substrates are transported from one processing station to another, and two or more different processes are carried out simultaneously (on different substrates or batches of substrates) in a common vacuum environment. In the semiconductor wafer processing system described in aforementioned U.S. Pat. No. 4,311,427, the wafers are in a common vacuum environment even though they are being individually processed. In at least some cases of magnetic disk processing it is desirable to avoid cross-contamination arising from widely differing processes simultaneously taking place at the various processing stations.

Many coating systems employ a substrate transport system. In most cases the various fixed and moving parts of the transport system become at least partially coated incidentally along with the substrates. The flaking of deposited material from the transport system, especially from the moving parts, leads to the generation of particulates, which may be detrimental to the substrates. This leads to the need for frequent servicing of the substrate transport system.

A technique known as RF (Radio Frequency) sputtering is frequently employed when the coating source material is an insulator or a poor conductor of electricity. When RF sputtering is used inside a vacuum enclosure, RF electric fields and currents tend to be established at various places within the enclosure. Leakage of RF out of the vacuum enclosure generally gives rise to radiation of RF power into the surrounding environment. To keep such radiation below acceptable levels, it is frequently necessary to apply RF shielding, grounding, and/or filtering means to each of the various mechanical motion feedthroughs, electrical feedthroughs, conduits, and apertures which penetrate the vacuum enclosure, whether or not a particular feedthrough or opening is directly associated with the operation of the RF sputtering process. In many cases only a small fraction of the feedthroughs and openings is so associated. If means were provided to eliminate the need for the shielding, etc., of those feed-throughs and openings not directly involved, significant savings in system complexity and cost could accrue.

In important applications to semiconductor wafer processing, systems with a fixed number of processing stations can be entirely satisfactory. Magnetic disk technology has not yet matured to a similar point. Flexibility in the number and type of individual processing stations is required.

In most semiconductor wafer applications, the required coatings are nonmagnetic and are deposited from magnetron sputter coating souces employing nonmagnetic targets. With magnetic disks, the major and critically important coatings are of magnetic material, and additional coatings of nonmagnetic materials may also be required. Present-day magnetron sputter coating sources have been designed to operate efficiently with nonmagnetic targets. Improved means for coating disks with magnetic materials are required if magnetic disk manufacturing systems are to be useful.

Magnetron sputter coating sources include cathode and anode structures, and are operated in an evacuated chamber back-filled with a sputter gas (typically argon at subatmospheric pressure). Voltage is applied between cathode and anode to establish a glow discharge. Positive ions formed in the space between anode and cathode impact a sputter target located on the cathode surface, ejecting (by sputtering) atoms of target material from the surface and near subsurface atomic layers of the target. These sputtered atoms deposit desirably on workpieces or substrates placed generally in line-of-sight of the sputter target. Sputtered atoms also deposit incidentially on various accessible surfaces, such as substrate holders, sputter shields, and chamber walls.

In using magnetron sputter coating sources, it is necessary to provide means for monitoring and controlling sputter gas pressure. Freshly-deposited films of many materials provide sites for physical adsorption (physisorption) of various gases, and also sites for chemical combination with (or chemisorption of) certain specific gases. The incorporation of excessive amounts of particular gases into the deposited films can result in contaminated coatings. It is therefore necessary to ensure adequately low levels of contaminant gases in the sputter gas atmosphere. This normally involves continuous pumping by a means which removes the sputter gas as well as the contaminant gases. A continuous inlet flow of sputter gas is therefore required to maintain the desired sputter gas pressure.

In vacuum coating systems generally, it is necessary to periodically replenish the supply of coating material, or to otherwise service the coating source or processing station. In most cases this necessitates shutting down the entire system or a major portion thereof and venting it to atmosphere. Returning the system to a clean operating condition introduces a significant time delay and interruption of production. Generally speaking, means for reducing system downtime associated with the servicing of processing stations can provide substantial benefits.

Accordingly, it is an object of the invention to handle and transport thin substrates in a manner that allows them to be individually coated and otherwise processed from both sides simultaneously.

It is also an object of the invention to provide means for avoiding cross-contamination among the various individual processing stations.

Another object of the invention is to minimize the incidental coating of the fixed and moving parts of the substrate handling and coating system.

Yet another object of the invention is to restrict the need for RF shielding, grounding, and/or filtering to those feedthroughs and openings directly associated with an RF process.

Still another object of the invention is to provide an improved means for controlling sputter gas pressure and purity.

A further object of the invention is to provide easy flexibility in building systems with differing numbers and types of individual processing stations.

It is an additional object of the invention to provide means for reducing system downtime associated with servicing individual processing stations.

Additional objects and features will become apparent from the ensuing description of the invention.

SUMMARY OF THE INVENTION

In one aspect of the invention, novel means are provided to handle and transport thin substrates (disks or wafers) in a manner which allows them to be individually coated and otherwise processed simultaneously from both sides. Individual substrate lift blades are employed for the entrance and exit cassettes, the entrance and exit load locks, and the processing stations. A lift blade symmetrically engages the substrate near the lower half of its periphery, holding the substrate securely with the aid of gravity, and negligibly obscuring or eclipsing either substrate surface. A first lift blade elevates a vertically-oriented substrate from the entrance cassette to an open door of the entrance air-to-vacuum load lock. A novel means associated with the door securely accepts the substrate and brings it into the entrance lock. After evacuation of the entrance lock and transfer of the substrate to a second lift blade, the second lift blade retracts, bringing the substrate into the main vacuum chamber. A novel "walking beam" mechanism transfers the substrate to a third lift blade at the correct time in the handling cycle. The third lift blade then elevates the substrate into the first processing station, holding the substrate in place during coating or other processing from both sides simultaneously. After coating, the third lift blade retracts, and the walking beam transfers the substrate to the next position. This procedure continues until the substrate is transferred through the exit load lock and is finally deposited in the exit cassette. In production operation, all but one or two of the lift blades inside the machine will normally be holding individual substrates simultaneously.

In a linear embodiment of the invention, the entrance and exit cassettes and load locks are located at opposite ends of the machine. In a U-shaped embodiment, a reversing mechanism, such as a rotating beam mechanism or a transverse motion mechanism, is employed to transfer the substrates from the entrance side to the exit side of the machine, and the entrance and exit cassettes and load locks are now located at the same end of the system. In either embodiment, the machine is of modular design to allow flexibility in choosing the number and types of processing stations.

Associated with each of the lift blades within the main vacuum chamber is a sealing means such that when the lift blades are in the elevated position all load locks and processing chambers are isolated from the main vacuum system. Roughing pump vacuum is available to each of the load locks and processing stations, and each processing station may be provided with a dedicated high vacuum pump, which may be valved in or out as required. The various processing stations are thus isolated one from another during operation, thereby avoiding or greatly reducing cross-contamination. With the lift blades retracted during non-operation, the processing stations and the load locks share the common vacuum of the main chamber.

Additional benefits accrue from having the individual processing stations isolated during their operation. One is that incidental coating of the substrate handling system is limited to the lift blades. Such moving parts as the walking beam and rotating beam or transverse motion mechanisms are not subjected to incidental coating. As a result, the generation of substrate-contaminating particulates is greatly reduced, which reduces correspondingly the need for servicing of the substrate handling system.

Another benefit is that the need for RF shielding, grounding, and/or filtering of various feedthroughs and openings can be restricted to only those particular individual stations in which RF processes are employed. The feedthroughs and openings which penetrate the main vacuum chamber walls, for example, are exempt from the need for RF shielding, etc. Significant reductions in system complexity and attendant costs can therefore result.

Another potential benefit of isolating the processing stations is associated with the handling, purification, and pumping of the sputter gas (normally argon). Freshly-deposited films from many metal and metal alloy sputter targets react chemically with such common contaminant gases as oxygen and water vapor, removing them by "getter pumping". In processing stations employing such sputter target materials, films deposited on sputter shields, for example, during the immediately preceding cycle can serve to maintain an acceptably low level of contaminant gases after elevation of the lift blade has brought the next substrate into position and isolated the chamber. In such cases it may be unnecessary to operate a dedicated high vacuum pump, relying instead on the above-mentioned getter pumping. Since the sputter gas (normally argon) is chemically inert, it is not removed by getter pumping, and is removed relatively slowly by the "ion pumping" action of the glow discharge. It may therefore suffice to inject a single "charge" of sputter gas for each process cycle. Any contaminant gases introduced with the charge of sputter gas could be removed by getter pumping prior to initiation of the glow discharge, thereby purifying the sputter gas atmosphere. Upon completion of the sputter coating cycle, the sputter gas could be pumped away by the vacuum pump for the main chamber when the lift blade is retracted. A dedicated high vacuum pump may therefore not be needed by such a processing station, leading to significant system simplification and cost savings. Also, a sputter gas atmosphere of lower contaminant level could be maintained because only a single charge of sputter gas, with associated contaminants, is introduced for each process cycle.

When servicing of one or more individual processing stations becomes necessary, operation of the system is temporarily interrupted with the lift blades in the elevated position. All processing stations and load locks are thus sealed off from the main vacuum chamber. For servicing a single processing station, its dedicated pump is valved off, and the processing station is vented to atmosphere. Appropriate sections of the processing station are removed and replaced with suitably replenished and preprocessed sections. Alternatively, the entire processing station can be removed and replaced with a new or refurbished one which has been prepared off-line while the coating system has been in production. The processing station is then exhausted (rough pumped) and its dedicated vacuum pump is valved in. After a brief conditioning operation, the lift blades are lowered and normal operation of the system is resumed. Servicing of the selected processing station has not required venting the other processing stations or the main vacuum chamber to atmosphere. System downtime has thereby been greatly reduced.

DETAILED DESCRIPTION

Figure 1:
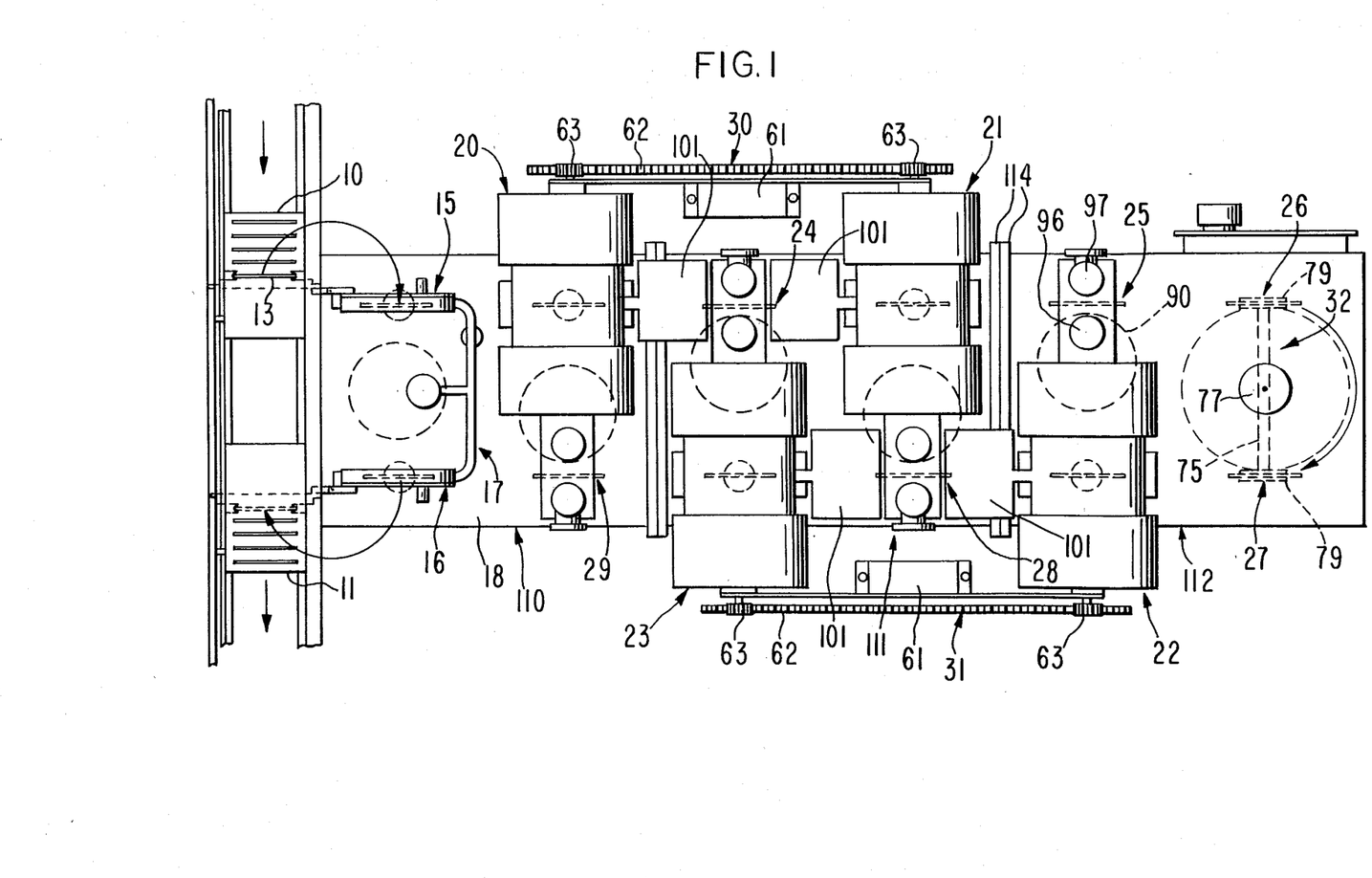
FIG. 1 is a plan view, partially schematic, of a U-shaped embodiment of the present invention.
Figure 2:
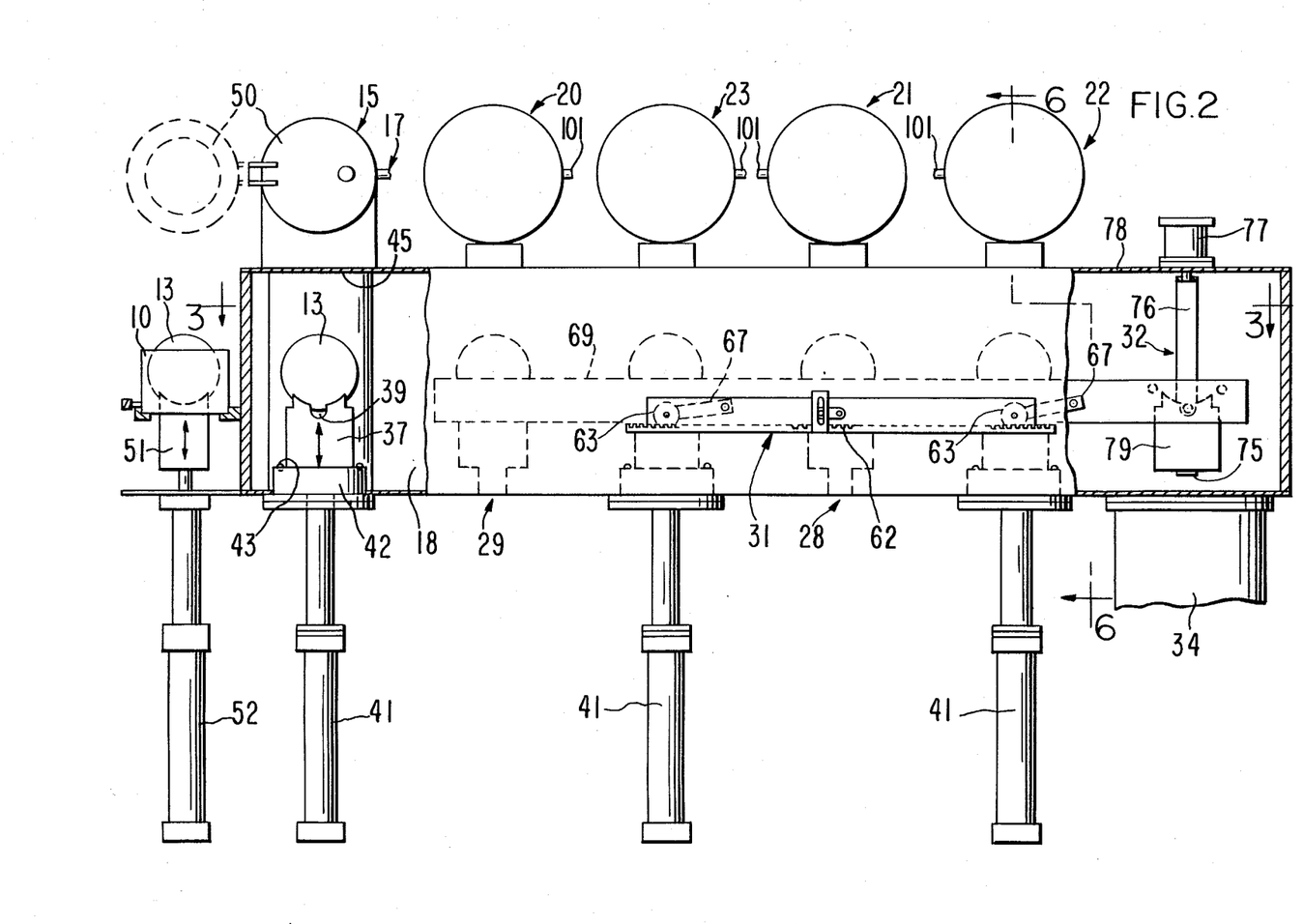
FIG. 2 is a side view, partially schematic and partially in section, of FIG. 1.

Referring now to the drawings, FIG. 1 shows a top view, partially schematic, of a U-shaped embodiment of the present invention, and FIGS. 2-10 show various alternative views of this embodiment. As shown in FIG. 1, the coating system includes: entrance and exit cassettes 10 and 11 carrying thin substrates (disks or wafers) 13; entrance and exit load locks 15 and 16, and an associated venting and evacuation system 17; a main vacuum chamber 18; processing stations 20-23; "idle" stations 24-29; walking beam mechanisms 30 and 31; and a rotating beam mechanism 32. As shown in FIG. 2, the main vacuum chamber 18 is evacuated through a conduit 34 by a suitable pumping means, such as a cryopump.

Loading and unloading of substrates into and out of cassettes 10 and 11 may be understood with the aid of FIGS. 1, 2, and 6-9. Shown in FIG. 2 in partial section is entrance load lock 15 and associated grooved lift blade 37, which is empty (that is, not carrying a substrate 13) at the start of the load cycle. A groove 38 in lift blade 37 may be seen in FIGS. 6 and 9, and a relieved central portion 39 is shown in FIGS. 2, 4, 5, 7, and 8. The purpose of relieved portion 39 is to facilitate the transfer of substrates 13 by walking beam mechanisms 30 and 31, as will be discussed in detail subsequently. Lift blade 37 is elevated and retracted by a bellows-sealed, air-operated cylinder 41. To initiate the load cycle, lift blade 37 is elevated by air-cylinder 41 into load lock 15. Associated with lift blade 37 is a flange 42 of a generally rectangular shape and carrying an O-ring 43, which serves to form a vacuum seal to a mating bottom plate surface 45 of load lock 15 when lift blade 37 is in the elevated position. Safely isolated from main vacuum chamber 18, load lock 15 is then vented by means of system 17, and a door 50 of load lock 15 is rotated 180° to a fully opened position (by means not shown) to receive a substrate 13.

Figure 7:
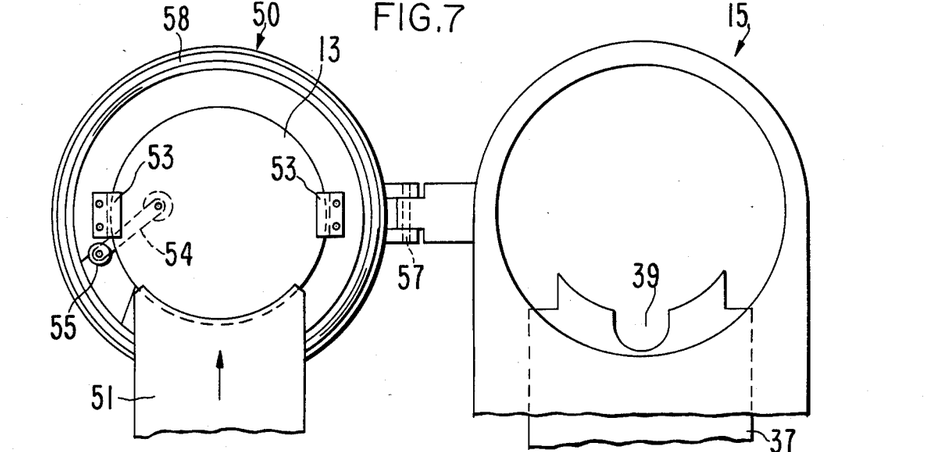
FIGS. 7-9 show the means by which thin substrates are transferred from the entrance cassette lift blade to the door of the entrance load lock, and the means by which the substrate is held by the door.
Figure 8:
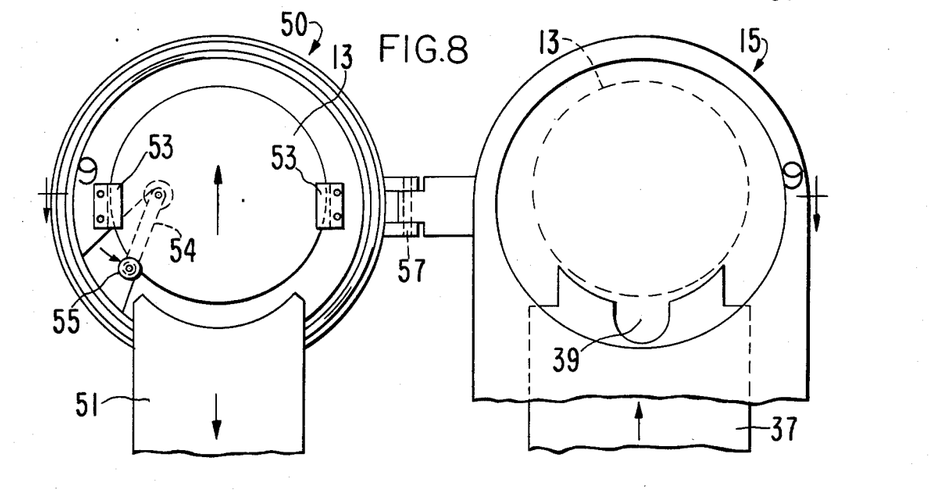
Figure 9:
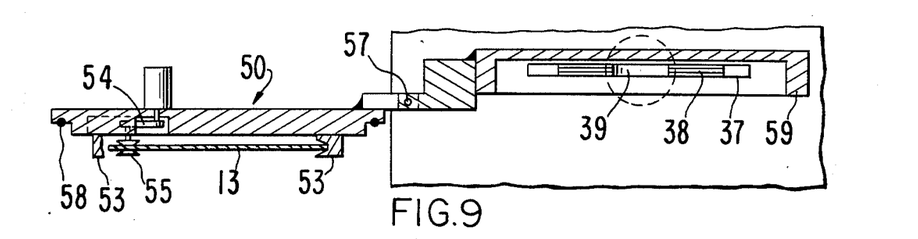

Another grooved lift blade 51 actuated by an air-operated cylinder 52 engages and carries a single substrate 13 from cassette 10 into a pair of grooved receiving guides 53 attached to door 50 of load lock 15 (see FIGS. 7-9). A lever arm 54 recessed inside door 50 and carrying a grooved guide 55 is actuated (by means not shown) to further engage substrate 13 and to elevate substrate 13 above lift blade 51. Lift blade 51 is then retracted through and below cassette 10 by air cylinder 52, and cassette 10 is indexed forward (by means not shown) in readiness for the next load cycle. After lift blade 51 has been retracted, door 50 is rotated about a hinge pin 57 to its closed position. Door 50 carries an O-ring 58 which effects a vacuum seal between closed door 50 and a mating surface 59 of load lock 15. Guides 53 and 55 are so positioned that adequate vertical clearance is provided between substrate 13 and lift blade 37. Load lock 15 is then evacuated by means of system 17, and lever arm 54 is retracted, allowing substrate 13 to drop down into grooved lift blade 37. Lift blade 37 carrying substrate 13 is then retracted by air cylinder 41 into main vacuum chamber 18.

The process of unloading a substrate 13 from main vacuum chamber 18 through exit load lock 16 and into exit cassette 11 is readily understood in the light of the process for loading through entrance load lock 15, as the various mechanisms employed in the two cases are essentially identical.

The cycle time for loading and/or unloading substrates is typically less than the normal operating time required for the processing stations 20-23.

Each of the load locks 15 and 16 and each of the processing stations 20-23 has associated with it a dedicated lift blade 37, a bellows-sealed, air-operated cylinder 41, a rectangular flange 42, an O-ring 43, and a mating bottom plate surface 45. Lift blades 37 are configured to hold substrates 13 during processing in stations 20-23. In particular, the lift blades 37 contain grooves 38 to symmetrically engage the substrates 13 near the lower halves of their peripheries in a manner which negligibly obscures or eclipses either substrate surface, thereby permitting simultaneous coating of both sides of substrates 13, which is particularly important in the manufacture of magnetic disks.

When the lift blades 37 are in their elevated positions, the corresponding load locks and processing stations are isolated from main vacuum chamber 18 by the vacuum seals between flanges 42, O-rings 43, and mating surfaces 45. Using independent valving arrangements (not shown), load locks 15 and 16 share venting and vacuum systems 17. As will be discussed more fully, each of the processing stations 20–23 may have its own independent vacuum system, whereby the various processing stations are isolated from each other during operation, thereby avoiding cross-contamination, and also providing other benefits, as will be discussed subsequently.

As shown in FIG. 1, "idle" stations 24, 25, 28, and 29 respectively following processing stations 20, 21, 22, and 23. These idle stations are fixed in position, and serve as convenient parking places for substrates 13, allowing them, for example, to cool and degas before entering the next processing station. The other two idle stations 26 and 27 are associated with rotating beam mechanism 32. Each of the idle stations 24–29 is configured, in essence, as a stationary lift blade to support substrates 13 in the same manner as lift blades 37.

Figure 3:
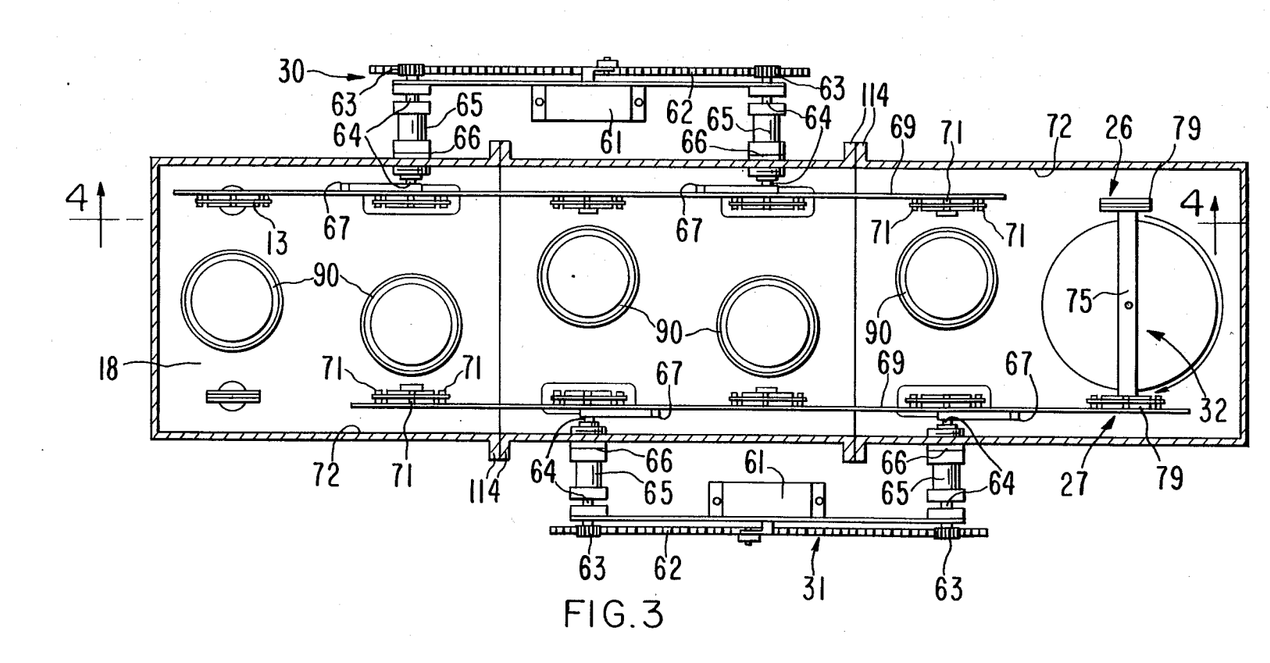
FIG. 3 is a cross-sectional view of FIG. 1, viewed from the top, showing the walking beam and rotating beam mechanisms.
Figure 4:
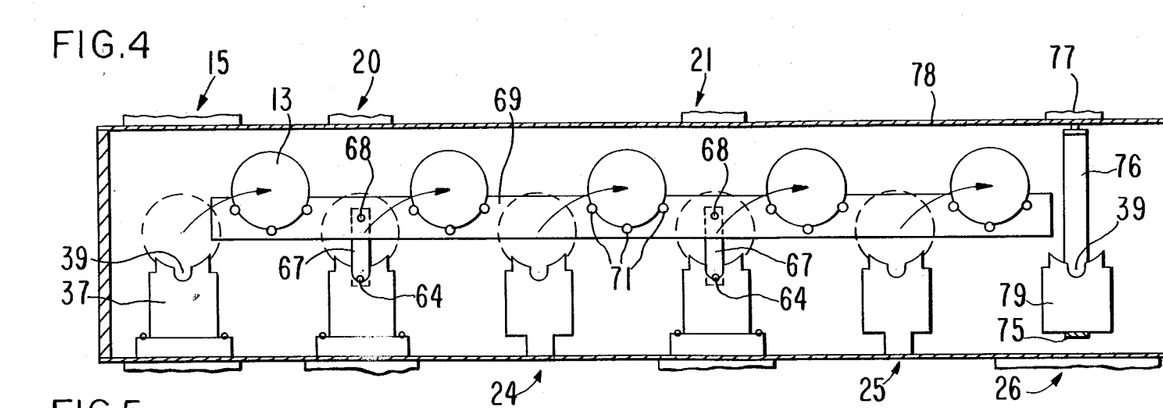
FIGS. 4 and 5 are cross-sectional side views, largely schematic, showing substrates being transferred by the walking beam mechanism.
Figure 5:
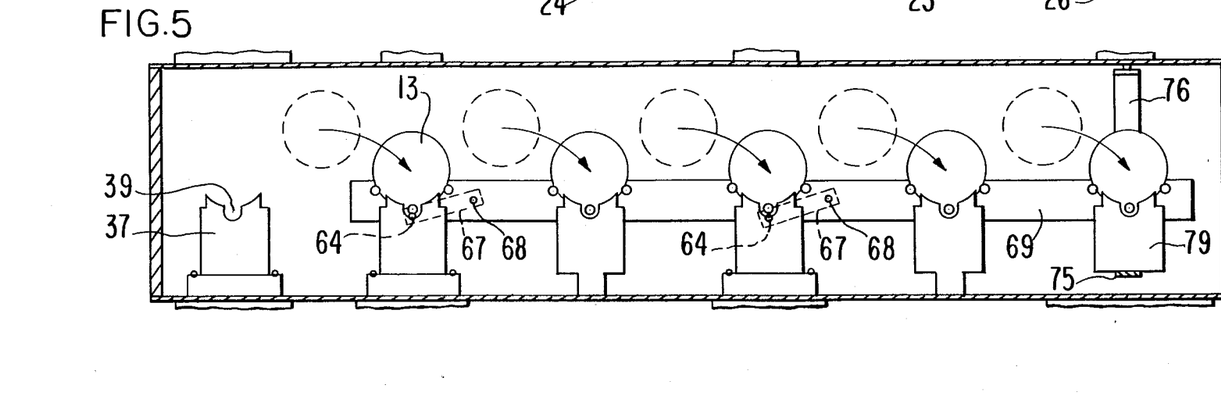

The task of transferring substrates 13 from one retracted position to another within main vacuum chamber 18 is accomplished with the aid of walking beam mechanisms 30 and 31 and rotating beam mechanism 32. FIGS. 3–5 are particularly useful in the description of this task. Under normal operating conditions of full production, and just prior to station-to-station transfer, substrates 13 will occupy lift blades 37 in retracted positions at entrance load lock 15 and at processing stations 20–23. Substrates 13 will also occupy fixed idle stations 24, 25, 28, and 29, plus idle station 27 associated with rotating beam mechanism 32. The only vacant stations will be idle station 26 associated with rotating beam mechanism 32 and lift blade 37 associated with exit load lock 16. Walking beam mechanism 30 will effect a one-station shift of substrates 13 from the position of entrance load lock 15 toward idle station 26, while walking beam mechanism 31 will cause a similar one-station shift from idle station 27 toward exit load lock 16. Each of the walking beam mechanisms 30 and 31 includes an external drive means 61 which drives a linear gear 62. Linear gear 62 engages a pair of circular gears 63 to rotate shafts 64. Shafts 64 pass through transverse motion mechanisms 65 and rotary vacuum seals 66 into main vacuum chamber 18, where they connect rigidly to arms 67, which in turn are rotatably connected through shafts 68 to beams 69. Grooved carriers 71 for substrates 13 are affixed to beams 69. In the embodiment shown in FIG. 3, grooved carriers 71 are short cylinders, and three grooved carriers 71 are employed for each of the substrates 13 in the embodiment shown in FIGS. 4 and 5. As noted earlier, each lift blade 37 contains a groove 38 and a relieved central portion 39. Similarly, each of fixed idle stations 24, 25, 28, and 29 contain a groove 38 and a relieved central portion 39. The purpose of groove 38 is to hold substrate 13 securely with the aid of gravity, and the purpose of relieved central portion 39 is to accommodate the central one of the three grooved carriers 71.

FIG. 3 shows the start-of-transfer position for walking beam mechanisms 30 and 31. FIG. 4 shows beam 69 of walking beam mechanism 30 in the "half-way" position, and FIG. 5 shows beam 69 near its final position.

Shown also in FIGS. 3–5 are the substrates 13 held on grooved carriers 71 in the three transfer positions. Upon operation of drive means 61, transport of beam 69 is accomplished through the intermediary of arms 67, which cause any selected point on beam 69 to follow a circular path from initial to final position. In this way, a substrate 13 is lifted on grooved carriers 71 from its initial position and deposited at its next station, with beam 69 positioned to completely disengage grooved carriers 71 from substrates 13. Upon completion of the transfers of substrates 13, beams 69 are moved by transverse motion mechanisms 65 toward the adjacent walls 72 of main vacuum chamber 18 (see FIG. 6), thereby freeing lift blades 37 for vertical transport of substrates 13. Beams 69 are then moved by external drive means 61 in a circular path back to the start-of-transfer position, except for a continued displacement toward walls 72 of main vacuum chamber 18. The dashed line positions in FIG. 6 of arms 67, beam 69, and grooved carriers 71 show portions of walking beam mechanism 30 in transit to the start-of-transfer position. Upon completion of the next processing cycle and return of lift blades 37 to their retracted positions, beams 69 are moved by transverse motion mechanisms 65 away from walls 72 of main vacuum chamber 18 back to the start-of-transfer position to enable grooved carriers 71 to engage substrates 13 for the next transfer cycle.

The cycle time for substrate transfer by walking beam mechanisms 30 and 31 is typically less than 10 seconds. For a 50-second processing time in processing stations 20–23, total cycle time is thus about 60 seconds.

The roles of walking beam mechanisms 30 and 31 in transferring substrates 13 to idle station 26 and from idle station 27 have been described above. A description now follows of how a substrate 13 is transferred from the position of idle station 26 to that of idle station 27. Rotating beam mechanism 32 comprises a beam 75 rigidly affixed to a vertical shaft 76 which connects with a rotary drive means 77 attached to a top plate 78 of main vacuum chamber 18. At the two ends of beam 75 are grooved substrate carriers 79, which are similar to lift blades 37 and idle stations 24, 25, 28, and 29 in that they contain grooves 38 and relieved central portions 39. At the beginning of the substrate transfer process, grooved substrate carrier 79 in the position of idle station 26 is empty, while the carrier 79 in idle station 27 is holding a substrate 13. After walking beams 30 and 31 have completed their transfer cycles and have retracted, carrier 79 in idle station 26 is holding a substrate 13 and carrier 79 in idle station 27 is empty. Rotary drive means 77 then operates to rotate beam 75 180°, whereby the carrier 79 in idle station 26 is now empty and the carrier 79 in the position of idle station 27 is again holding a substrate 13. Idle stations 26 and 27 are now in condition for the next transfer cycle.

It may be noted that in the transfer of a substrate 13 from idle station 26 to idle station 27 substrate 13 is rotated 180° about a vertical axis. This means that its position in exit cassette 11 is reversed from that in entrance cassette 10. In magnetic disk manufacture, such reversal of substrate 13 is of little consequence, as both sides of the substrate 13 (disk) are processed and coated identically. In some semiconductor wafer coating applications, however, it is desired to return a processed and coated substrate 13 (wafer) to the same position, including orientation, in the cassette from which it originally came, in which case the above-mentioned rotation of 180° about a vertical axis is to be avoided or corrected.

One means for accomplishing this is described subsequently in connection with FIG. 10.

In the embodiment shown in FIG. 1, four processing stations 20–23 are employed. In most cases, these processing stations will share common features, including processing substrates 13 from both sides while the substrates are held in lift blades 37, and isolation of the processing stations from main vacuum chamber 18 being provided by the vacuum seals between flanges 42, O-rings 43, and mating surfaces 45. In general, however, different processes will be carried out at the different stations. In the case of magnetic disk manufacturing, processing station 20, for example, may be used to heat and sputter etch substrate 13, processing stations 21 and 22 may be used to deposit coatings of magnetic material on both sides of substrates 13, and processing station 23 may be used to deposit a final protective coating. As will be discussed later, the need for additional processing stations can be readily accommodated because of the modular nature of the design and construction of the substrate handling and coating system.

Figure 6:
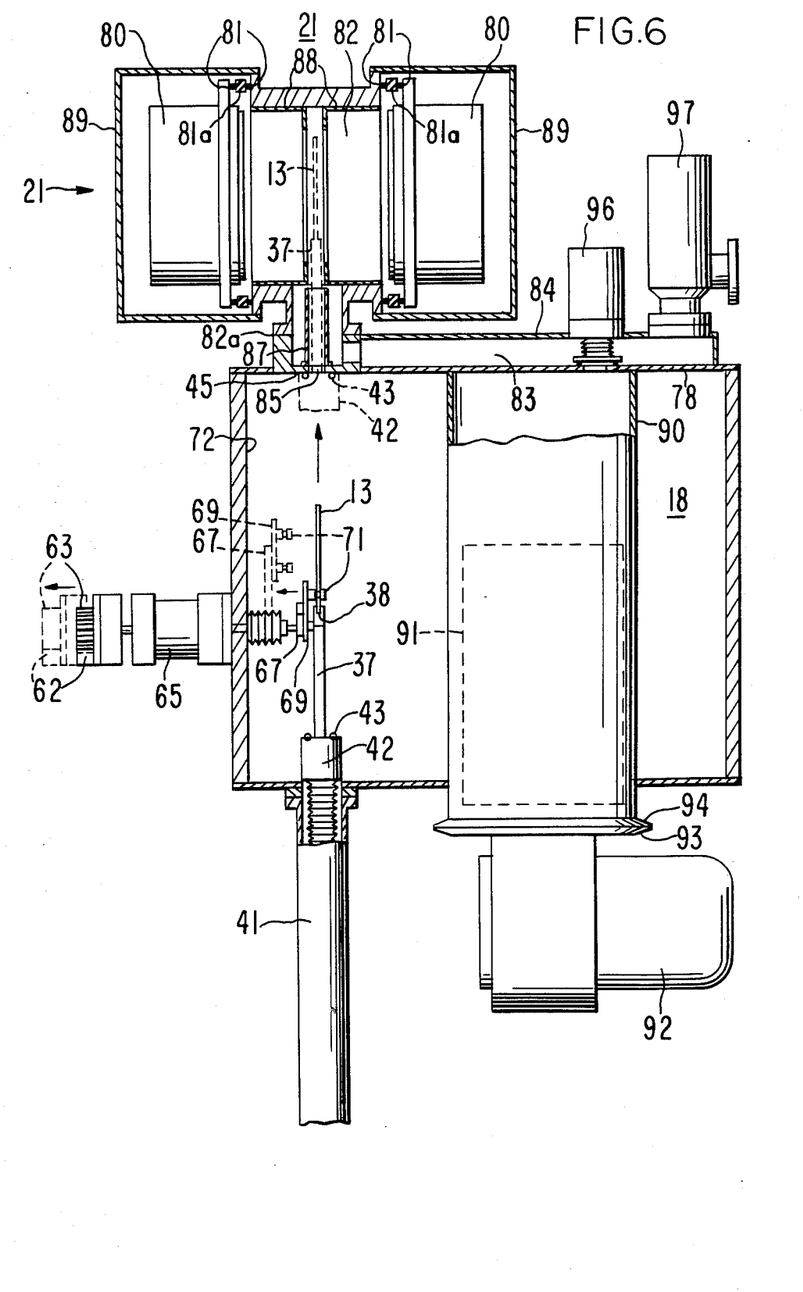
FIG. 6 shows, partially schematically and partially in section, a processing station, the associated lift blade, and the dedicated pumping means.

Some of the features and the operation of representative processing station 21 will now be described with the aid of FIG. 6. Two magnetron sputter coating sources 80 are removably sealed with elastomer gaskets 81 and insulating ring 81a to a central chamber 82, which is removably attached by means of a vacuum-tight joint 82a to top plate 78 of main vacuum chamber 18. A manifold 83 formed between top plate 78 and a wall member 84 is in vacuum communication with central chamber 82. A rectangular slot 85 passes through top plate 78 into central chamber 82 to permit introduction of lift blade 37 carrying substrate 13. Removable sputter shields 87 and 88 are provided to facilitate cleaning and servicing. Removable safety shields 89 made of non-conductive material are also provided. A cylindrical conduit 90 houses a cryopump 91, which is the dedicated high vacuum pump for processing station 21. Conduit 90 also provides structural reinforcing for main vacuum chamber 18, but the interior of conduit 90 is isolated in a vacuum sense from main vacuum chamber 18. Cryopump 91 and an associated displacer motor 92 are mounted on a vacuum flange 93, which mates with a corresponding vacuum flange 94 attached to conduit 90. Cryopump 91 is valvably connected to processing station 21 via a poppet valve 96 in manifold 83. When required, rough pumping of processing station 21 is provided through a roughing valve 97 connected to manifold 83. Not shown is the back-to-air valve for venting processing station 21 to atmosphere. Connected to central chamber 82 of processing station 21 is a capacitance manometer 101 (see FIGS. 1 and 2) which is used for accurate measurement of the pressure of sputter gas (typically argon) during sputter deposition. Also appended to central chamber 82, but not shown, are an argon gas flow control valve, an argon gas flow monitor, and a cold cathode vacuum gauge for measuring high vacuum. Associated with the magnetron sputter coating sources 80, but not shown, are glow discharge power supply lines, water cooling lines, magnet power supply lines, and Hall probes for measuring magnetic fields inside the magnetron sputter coating sources 80.

In normal operation, poppet valves 96 are closed during transfer of substrates 13 by walking beam mechanisms 30 and 31, thereby isolating the dedicated cryopumps 91 from the main vacuum chamber 18. Once transfer of substrates 13 is completed, beams 69 are retracted, allowing air cylinders 41 to elevate lift blades 37 into their respective processing stations. Referring now to FIG. 6, processing station 21 is isolated from main vacuum chamber 18 by the vacuum seal between flange 42, O-ring 43, and mating surface 45. Poppet valve 96 is then opened to allow processing station 21 to be pumped by its dedicated cryopump 91. Argon flow rate is adjusted to give the desired argon pressure, as measured by capacitance manometer 101. Power is applied to the magnetron sputter coating sources 80 at levels and for times required to produce the desired coatings. As an example, a 1,000 Angstrom-thick layer of Permalloy might be deposited on each side of the magnetic disk in 30–50 seconds at a source power level of less than 2 kilowatts per side. When the coating is finished, power to sources 80 is shut off and the argon flow valve is closed. Then poppet valve 96 to cryopump 91 is closed, and lift blade 37 carrying substrate 13 is retracted. The system is now ready for the next substrate transfer cycle by walking beam mechanism 30 and 31 and rotating beam mechanism 32.

In the above-described embodiment, beams 69 of walking beam mechanisms 30 and 31 undergo four distinct movements: (1) inward translation (away from walls 72 of main vacuum chamber 18) to permit grooved carriers 71 to engage substrates 13; (2) arcuate motion (shown convex upward in FIGS. 4 and 5) from initial to final position; (3) outward translation (toward walls 72); and (4) convex arcuate motion back to the start-of-transfer position.

In an alternative embodiment (not shown), walking beam mechanisms 30 and 31 cause beams 69 and associated grooved carriers 71 to execute concave rather than convex upward motions. Eight distinct movements (rather than four) are now required: (1) inward translation; (2) reverse arcuate motion (small arc) to permit grooved carriers 71 to engage and elevate substrates 13 above lift blades 37; (3) outward translation (to clear lift blades 37); (4) concave arcuate motion from initial to final angular position; (5) inward translation; (6) reverse arcuate motion (small arc) to permit release of substrates 13 from grooved carriers 71 to lift blades 37; (7) outward translation; and (8) concave arcuate motion back to the start-of-transfer position.

Although the concave embodiment is somewhat more complex than the convex one (requiring eight rather than four distinct movements of beams 69), no additional drive mechanisms are required. Because the added movements are relatively short, the impact on substrate transfer cycle time is comparatively small. One advantage of the concave embodiment is that the vertical height of main vacuum chamber 18 can be reduced, which reduces its fabrication cost. This reduced height of chamber 18 reduces the length of stroke required of bellows-sealed air-cylinders 41 for lift blades 37, which both reduces cost and improves reliability.

It was mentioned earlier that the 180° rotation of substrates 13 about a vertical axis produced by rotating beam mechanism 32 is to be avoided or corrected in certain important applications. Shown in FIG. 10 is a transverse motion mechanism 120 as an alternative to the rotating beam mechanism 32 of FIG. 3. Transverse motion is imparted to a shaft 121 by means of a bellows-sealed air-cylinder 122. A grooved substrate carrier 124 is affixed to shaft 121. Carrier 124 is similar to lift blades 37 and idle stations 24, 25, 28, and 29 in that it contains a groove 38 and a relieved central portion 39. At the beginning of the substrate transfer process, carrier 124 holding a substrate 13 is in the position of idle station 27.

As soon as the grooved carriers 71 on beams 69 have lifted substrates 13 from lift blades 37, idle stations 24, 25, 28, and 29, and carrier 124, air-cylinder 122 is activated to quickly move shaft 121 and attached carrier 124, which is now empty, to the position of idle station 26, where dashed lines denote the locations of shaft 121 and carrier 124. Empty carrier 124 is now in position to receive a substrate 13 from the appropriate grooved carriers 71. After a substrate 13 has been deposited on carrier 124, air-cylinder 122 is activated to return carrier 124 with a substrate 13 to the position of idle station 27, in condition for the next substrate transfer cycle. It is evident that transverse motion mechanism 120 has effected a rotationless transfer of a substrate 13 from idle station 26 to idle station 27, which is important in certain applications.

Figure 10:
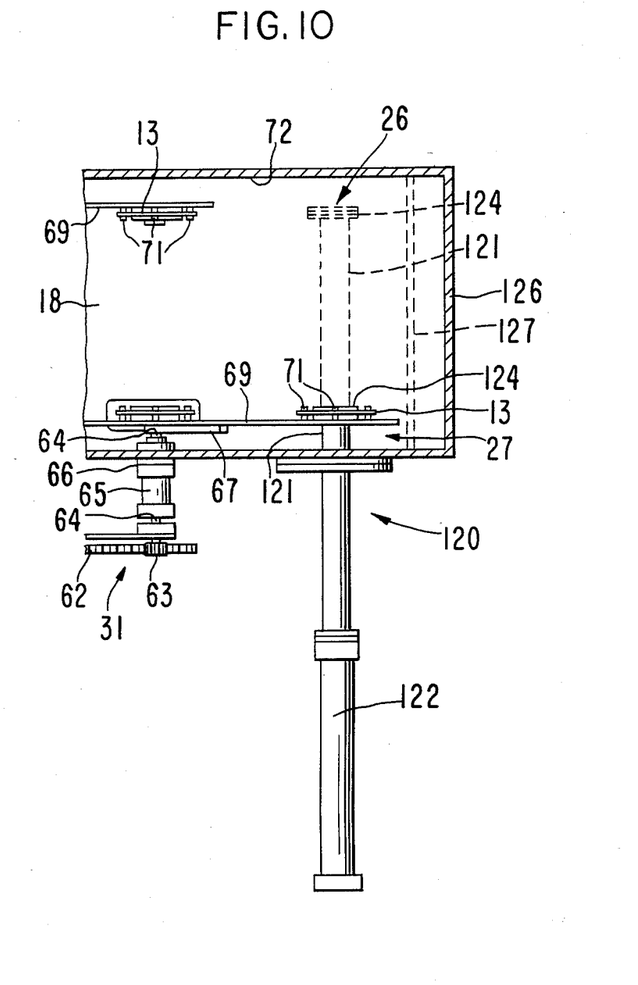
FIG. 10 is a fragmentary portion of FIG. 3 showing a transverse motion mechanism as an alternative to the rotating beam mechanism of FIG. 3.

In comparing FIGS. 3 and 10, it may be noted that transverse motion mechanism 120 occupies less longitudinal space than rotating beam mechanism 32. This allows main vacuum chamber 18 to be shortened by moving an end wall 126 to a dashed line position 127, thereby reducing fabrication cost and floor space occupied.

It has been noted in the foregoing description that processing station 21 is isolated from main vacuum chamber 18 during processing by the vacuum seal between flange 42, O-ring 43, and mating surface 45, and that processing station 21 has its own dedicated vacuum system including cryopump 91. As may be seen from the drawings, a similar situation exists for each of the other processing stations 20, 22 and 23. Thus it is that during processing each of the processing stations 20-24 is isolated one from another as well as from main vacuum chamber 18. Cross-contamination during processing is thereby avoided or greatly reduced.

Another benefit of having processing stations 20-23 isolated during their operation is that incidental coating of the substrate handling system is limited to lift blades 37. Moving parts of walking beam mechanisms 30 and 31, such as rotating shafts 64, arms 67, shafts 68, beams 69, and grooved carriers 71 all avoid incidental coating, as do the various parts associated with rotating beam mechanism 32 or transverse motion mechanism 120. As a result, the generation of particulates which might contaminate or damage substrates 13 is greatly reduced, which reduces correspondingly the need for cleaning and servicing of the substrate handling system.

A further benefit of having isolated processing stations is that the need for RF shielding, grounding, and/or filtering of various feedthroughs and openings can be restricted to only those particular individual stations in which RF processes are employed. In the absence, for example, of processing station isolation, special grounding means would need to be provided for shafts 64 of walking beam mechanisms 30 and 31, and also for vertical shaft 76 of rotating beam mechanism 32. Electrical leads associated with pressure measuring gauges (not shown) for main vacuum chamber 18 would need to be surrounded by grounded shielding, and special RF filters might be required. With processing station isolation, the need for such RF shielding, etc., is avoided, with reductions in system complexity and cost.

Another potential benefit of isolating the processing stations is associated with the handling, purification, and removal of the sputter gas, which is normally argon. Freshly-deposited films from many metal and metal alloy sputter targets act as "getter pumps" for contaminant gases such as oxygen and water vapor. In processing stations employing such sputter target materials, films deposited on sputter shields 87 and 88 (as in FIG. 6 for processing station 21) during an immediately preceding coating cycle can serve to maintain an acceptably low level of contaminant gases after elevation of lift blade 37 has brought the next substrate 13 into its coating position and has isolated processing station 21 from main vacuum chamber 18 by means of flange 42 and O-ring 43. In this case, it may be unnecessary to open poppet valve 96 to dedicated cryopump 91, relying instead on getter pumping by the freshly-deposited film on sputter shields 87 and 88. Since the sputter gas (normally argon) is chemically inert, it is not removed by getter pumping, and is removed relatively slowly by the "ion pumping" action of the glow discharge. It may therefore suffice to inject a a single "charge" of sputter gas for each process cycle. Any contaminant gases introduced with the charge of sputter gas could be removed by getter pumping prior to initiation of the glow discharge, thereby purifying the sputter gas atmosphere. Upon completion of the sputter coating cycle, the sputter gas could be pumped away by the vacuum pump for main vacuum chamber 18 when lift blade 37 is retracted. It is possible, then, that a dedicated high vacuum pump (cryopump 91) is unnecessary for processing stations in which there is sufficient getter pumping by freshly-deposited films on surfaces such as sputter shields 87 and 88, in which case a simpler and lower cost coating system could result. Also, a sputter gas atmosphere of lower contaminant level could be maintained because only a single charge of sputter gas with associated contaminants is introduced for each process cycle.

It is necessary to service the various processing stations 20-23 on a periodically scheduled (and sometimes on an unscheduled) basis. Replenishment of sputter target material in the magnetron sputter coating sources 80 of processing station 21 is an example of one need for periodic service. In most prior art systems, such service necessitates shutting down the entire system and venting it to atmosphere. Returning the system to clean operating conditions introduces significant time delays and interruptions of production.

In one aspect of the present invention, servicing of a selected processing station does not require venting of the other processing stations or of the main vacuum chamber to atmosphere. When servicing of one or more individual processing stations becomes necessary, operation of the system is temporarily interrupted with the lift blades in the elevated position. All processing stations and load locks are thus sealed off from the main vacuum chamber. For servicing a single processing station, its dedicated pump is valved off, and the processing station is vented to atmosphere. Appropriate sections of the processing station are removed and replaced with suitably replenished and preprocessed sections. Alternatively, the entire processing station can be removed and replaced with a new or refurbished one. The processing station is then exhausted (rough pumped) and its dedicated vacuum pump is valved in. After a brief conditioning operation, the lift blades are lowered and normal operation of the system is resumed. Servicing of the selected processing station has not required venting the other processing stations or the main vacuum chamber to atmosphere. System downtime has thereby been greatly reduced.

It may be noted from FIG. 1 that processing stations 20 and 21 on the entrance load lock side of the machine are opposite idle stations 29 and 28 on the exit load lock side. This arrangement leads to a narrower machine, and with it more efficient utilization of space and materials than would be the case if processing stations 20 and 21 were opposite processing stations 23 and 22, for example.

As noted earlier, some applications may require additional processing stations beyond the four processing stations 20-23 shown in the disclosed embodiment. It may be noted in FIG. 1 that the disk or wafer handling and coating system is shown in three separately-flanged sections, 110, 111, and 112, coupled one to another by flanges 114. Additional pairs of processing stations and idle stations could be conveniently added, even in the field, by adding one or more separately-flanged sections 111, with, of course, appropriate modifications of walking beam mechanisms 30 and 31.

Also, as noted earlier, a U-shaped embodiment of the present invention is disclosed in FIG. 1 and other of the drawings. Clearly, linear, and even other, embodiments are possible, and may be preferred in certain applications. The U-shaped embodiment, however, provides advantages of compactness and of loading and unloading at the same end of the machine.

One point of design flexibility resides in the number of idle stations in comparison with the number of processing stations. Except for the turn-around associated with the rotating beam mechanism 32 of FIG. 3, or the transverse motion mechanism 120 of FIG. 10, in the U-shaped embodiment, idle stations could be eliminated altogether, thereby minimizing the inventory of substrates resident within the handling and coating system. Depending on the details of the application, considerations such as time for cooling and degassing could favor an even larger number of idle stations than shown in the embodiment of FIG. 1.

It will be seen from the foregoing that the present invention provides a novel system for handling and individually processing thin substrates, such as magnetic disks and semiconductor wafers. Although many modifications of the disclosed embodiment will occur to those skilled in the art, it is understood that this invention is to be limited only by the scope of the appended claims.

What is claimed is:

1. A system for handling and individually processing a plurality of relatively thin substrates, said substrates being vertically oriented during said handling and processing, said system comprising a main chamber, an entrance load lock and an exit load lock, a plurality of processing stations, load lock load/unload means, vertical transport means, and horizontal transport means, said load locks being positioned above said main chamber and sealed to a top wall thereof, said processing stations being disposed between said load locks and also sealed to said top wall of said main chamber, said load lock load/unload means being used to transfer said substrates from an entrance cassette to said entrance load lock and to transfer said substrates from said exit load lock to an exit cassette, said vertical transport means being used to raise said substrate from said main chamber into said processing stations and into said exit load lock, said vertical transport means also being used to lower said substrates from said entrance load lock and from said processing stations into said main chamber, said vertical transport means including a plurality of individual lift blades, each of said load locks and processing stations being served by a dedicated one of said lift blades, each of said lift blades being configured to securely hold an individual one of said substances during vertical transport, said lift blades for said processing stations being configured to hold said substrates during processing in said processing stations, said horizontal transport means being used to effect simultaneous one-station shifts of all said substrates within said main chamber, said shifts being directed toward said exit load lock; whereby said individual substrates are transported through said system, being processed sequentially in successive ones of said processing stations, all of said processing stations simultaneously processing one of said substrates, thereby allowing a high rate of production to be achieved.

2. A substrate handling and processing system as in claim 1 wherein each of said lift blades is grooved to symmetrically engage one of said substrates near the lower half of the periphery of said substrate, said lift blade holding said substrate securely with the aid of gravity.

3. A substrate handling and processing system as in claim 2 wherein each of said lift blades associated with one of said processing stations is configured to negligibly obscure either surface of said substrate, thereby allowing simultaneous processing of both sides of said substrate to be carried out.

4. A substrate handling and processing system as in claim 2 wherein said lift blades are configured to allow a plurality of grooved carrier members of said horizontal transport means to engage and remove said substrates from said lift blades and to deposit said substrates on adjacent lift blades.

5. A substrate handling and processing system as in claim 4 wherein each of said lift blades has a centrally relieved portion to allow a centrally positioned one of said grooved carrier members to be employed, thereby ensuring a secure engagement of said substrate by said grooved carrier members.

6. A substrate handling and processing system as in claim 1 wherein associated with said lift blades are sealing means such that all of said processing stations and load locks are sealed off from said main chamber when said lift blades are in their raised positions, whereby said processing stations and load locks are isolated from said main chamber and from one another during operation of said processing stations and load locks.

7. A substrate handling and processing system as in claim 6 wherein said processing stations and load locks are accessed by said lift blades through small apertures of generally rectangular shape between said main chamber and said processing stations and load locks, said lift blade sealing means being provided by generally rectangular flanges attached to and directly below said lift blades, said flanges carrying O-rings to provide seals against mating surfaces located on interior surfaces of said top wall of said main chamber.

8. A substrate handling and processing system as in claim 6 wherein said main chamber is provided with a main high vacuum pump, said load locks are provided with rough vacuum pumping means, and each of said processing stations is provided with access to rough pumping means and may also be provided with a dedicated high vacuum pump, thereby enabling vacuum coating processes to be carried out in selected ones of said processing stations.

9. A substrate handling and processing system as in claim 8 wherein each of said processing stations is dedicated to a specific process, with generally differing processes being carried out by the various ones of said processing stations, the possibility of cross-contamination among said differing processes being greatly reduced through said lift blade sealing means and said dedicated high vacuum pumps.

10. A substrate handling and processing system as in claim 9 wherein RF processes are employed in a selected few of said processing stations, said lift blade sealing means restricting the need for RF shielding to said selected few processing stations.

11. A substrate handling and processing system as in claim 8 wherein two magnetron sputtering coating sources are employed in each of selected ones of said processing stations, said two coating sources being positioned to allow simultaneous coating of both sides of said substrate.

12. A substrate handling and processing system as in claim 11 wherein said magnetron sputter coating sources are removably sealed to said selected processing stations, allowing the removal of said coating systems and associated shielding from a selected one of said processing stations while said dedicated lift blade is in its raised position without causing said main chamber to be vented to atmosphere, whereby suitably replenished and reprocessed coating sources and associated shielding can be installed, said selected processing station can be evacuated by said rough pumping means and said dedicated high vacuum pump, and said dedicated lift blade can be returned to its lowered position in said main chamber, allowing normal operation of said substrate and handling system to resume after a minimal downtime.

13. A substrate handling and processing system as in claim 8 wherein said processing stations are removably sealed to said top wall of said main chamber, allowing removal of said processing stations from said main chamber with said lift blades in their raised positions without breaking the vacuum of said main chamber, whereby replacement processing stations can be installed and evacuated, and said lift blades can be returned to their lowered positions in said main chamber, allowing normal operation of said substrate handling and processing system to resume after minimal downtime.

14. A substrate handling and processing system as in claim 11 wherein a coating material being dispensed by said magnetron sputter coating sources in specified ones of said processing stations is effective in removing contaminant gases by getter pumping, much of said getter pumping occurring on sputter shields and interior surfaces of said specified processing stations, whereby operation of said dedicated high vacuum pumps for said specified processing stations can be suspended during operation of said magnetron sputter coating sources, allowing a reduced flow of a sputter gas required to maintain a desired sputter gas atmosphere and pressure to allow a desired operation of said magnetron sputter coating sources, leading to a reduction in contaminant gases introduced with said sputter gas, thereby lowering the level of contaminant gases in said sputter gas atmosphere, and lowering in turn the incorporation of impurities into the coatings on said substrates.

15. A substrate handling and processing system as in claim 14 wherein the need for said dedicated high vacuum pumps for said specified processing stations is eliminated altogether, with high vacuum pumping needs being provided by said getter pumping.

16. A substrate handling and processing system as in claim 1 wherein said processing stations and load locks are disposed in a generally linear array, with said entrance and exit load locks being at opposite ends of said main chamber.

17. A substrate handling and processing system as in claim 16 wherein said horizontal transport means is a walking beam mechanism, said walking beam mechanism comprising a plurality of grooved substrate carriers affixed to a beam, a first pair of shafts rotatably attached to said beam, a second pair of shafts passing through a sidewall of said main chamber, a pair of radially positioned arms being rigidly connected to said first and second pairs of shafts, said second pair of shafts being connected to external drive means capable of imparting both rotary and axial motions to said second pair of shafts, whereby said grooved substrate carriers may be caused to move radially and axially in a manner to allow said grooved substrate carriers to simultaneously remove all said substrates from a start-of-transfer position on said lift blades and to deposit all said substrates at an end-of-transfer position on said lift blades, said end-of-transfer position being one station removed in a direction toward said exit load lock from said start-of-transfer position.

18. A substrate handling and processing system as in claim 17 wherein said grooved substrate carriers are caused to undergo four distinct movements in a transfer cycle, a first movement being axially inward from a plane adjacent said sidewall of said main chamber to a plane defined by said substrates, bringing said grooved carriers adjacent and just below said substrates, a second movement being along a first convex upward arcuate path, whereby said substrates are engaged by said grooved carriers, lifted from said lift blades, carried along said first arcuate path, and deposited on said lift blades one station removed, a third movement being axially outward to said plane adjacent said sidewall of said main chamber, and a fourth movement being along a second arcuate path, bringing said grooved carriers back to their initial positions in readiness for the next transfer cycle.

19. A substrate handling and processing system as in claim 17 wherein said grooved substrate carriers are caused to move along concave downward rather than convex upward arcuate paths while carrying said substrates from said start-of-transfer position to said end-of-transfer position, said grooved carriers also being caused to move along concave downward paths during return to their initial positions in readiness for their next transfer cycle, thereby allowing a reduction in the vertical height of said main chamber and a corresponding reduction in the distance of vertical travel required for said lift blades.

20. A substrate handling and processing system as in claim 17 wherein said main chamber is composed of a plurality of flanged sections, each of said flanged sections other than end flanged sections having an integral number of processing stations sealed to a top wall thereof, conveying thereby a modularity to the construction of said substrate handling and processing system, whereby the total number of processing stations may be conveniently selected or changed as desired, requiring further only corresponding changes in said walking beam mechanism and overall size of said system.

21. A substrate handling and processing system as in claim 18 wherein idle stations are interspersed among said processing stations, each of said idle stations having an associated stationary lift blade, said stationary lift blade being configured and positioned to receive said substrates from said grooved substrate carriers of said walking beam mechanism, to hold said substrates in a stationary position within said main chamber during a processing cycle, and to release said substrates to said grooved carriers upon commencement of the next transfer cycle, the presence of said idle stations allowing time for additional operations, such as heating, cooling, or degassing, between processing cycles in said processing stations.

22. A substrate handling and processing system as in claim 21 wherein each of said processing stations is followed by one of said idle stations, said idle stations being smaller in size than said processing stations, allowing thereby a closer spacing to be employed between said stationary lift blades of said idle stations and said dedicated lift blades of said processing stations than would be possible between adjacent ones of said processing station lift blades in the absence of said idle stations, whereby the horizontal distance for transfer of said substrates between adjacent positions may be reduced, thereby reducing the vertical height of said convex arcuate paths followed by said grooved substrate carriers during transfer of said substrates, thereby allowing a reduction in the vertical height of said main chamber and a corresponding reduction in the distance of vertical travel required for said lift blades.

23. A substrate handling and processing system as in claim 1 wherein said processing stations and load locks are disposed in a generally U-shaped configuration, with said entrance and exit load locks being at the same end of said main chamber, said U-shaped configuration allowing said system to be more compact, and also providing greater convenience in loading and unloading said substrates.

24. A substrate handling and processing system as in claim 23 wherein said horizontal transfer mechanism comprises a first walking beam mechanism, a reversing mechanism, and a second walking beam mechanism, said first walking beam mechanism being positioned adjacent the sidewall on said entrance load lock side of said main chamber, said first walking beam mechanism being used to effect simultaneous one-station first shifts of all said substrates on said entrance load lock sides of said main chamber, said first shifts being directed from said entrance load lock toward said reversing mechanism, said reversing mechanism receiving individual ones of said substrates from said first walking beam mechanism, said reversing mechanism releasing individual ones of said substrates to said second walking beam mechanism, said second walking beam mechanism being positioned adjacent the sidewall on said exit load lock side of said main chamber, said second walking beam mechanism being used to effect simultaneous one-station second shifts of all said substrates on said exit load lock side of said main chamber, said second shifts being directed from said reversing mechanism toward said exit load lock.

25. A substrate handling and processing system as in claim 24 wherein said reversing mechanism is a rotating beam mechanism, said rotating beam mechanism comprising a pair of grooved substrate carriers mounted on a beam affixed to a vertically oriented rotatable shaft passing through said top or bottom wall of said main chamber, said shaft being connected to an external drive means capable of imparting desired rotary motions to said shaft, said grooved carriers on said entrance load lock side of said main chamber being empty of said substrates at the start of a substrate transfer cycle, said grooved carrier on said exit load lock side of said main chamber holding one of said substrates at the start of said substrate transfer cycle, said first walking beam mechanism depositing one of said substrates on said empty grooved carrier on said entrance load lock side during said substrate transfer cycle, said second walking beam mechanism removing said substrate from said grooved carrier on said exit load lock side during said substrate transfer cycle, said beam being rotated 180° following completion of said substrate transfer cycle and prior to initiation of a next substrate transfer cycle, whereby said grooved carrier on said exit load lock side is holding one of said substrates and said grooved carrier on said entrance load lock side is empty and in condition to receive one of said substrates during said next substrate transfer cycle.

26. A substrate handling and processing system as in claim 24 wherein said reversing mechanism is a transverse motion mechanism, said transverse motion mechanism comprising a single grooved substrate carrier affixed to a shaft passing through a sidewall of said main chamber, said shaft being connected to an external drive means capable of imparting a desired linear motion to said shaft, said grooved carrier holding one of said substrates and being positioned on said exit load lock side of said main chamber at the start of a substrate transfer cycle, said second walking beam mechanism removing said substrate from said grooved carrier during the initial portion of said substrate transfer cycle, said shaft being quickly moved to bring now empty said grooved carrier into position on said entrance load lock side in time to receive one of said substrates from said first walking beam mechanism during said substrate transfer cycle, said first walking beam mechanism depositing one of said substrates on said empty grooved carrier, said shaft being returned to bring now occupied said grooved carrier into position on said exit load lock side in condition for a next substrate transfer cycle, thereby effecting a rotationless transfer of said substrates from said entrance load lock side to said exit load lock side.

27. A substrate handling and processing system as in claim 23 wherein each of said processing stations is followed by an idle station, each of said idle stations having an associated stationary lift blade, said stationary lift blade being configured and positioned to receive said substrates from said horizontal transport means, to hold said substrates in a stationary position within said main chamber while others of said substrates are being processed in said processing stations, and to release said substrates to said horizontal transport means upon commencement of the next substrate transfer cycle, the presence of said idle stations allowing time for other operations, such as heating, cooling, or degassing between processing cycles in said processing stations.

28. A substrate handling and processing system as in claim 27 wherein said idle stations on said entrance load lock side of said main chamber are deployed adjacent said processing stations on said exit load lock side, said idle stations being smaller in size than said processing stations, whereby said main chamber may be made narrower than would be possible with said processing stations on said entrance and exit load lock sides being positioned adjacent and directly across one from the other.

29. A substrate handling and processing system as in claim 28 wherein said main chamber is composed of a plurality of flanged sections, each of said flanged sections other than end flanged sections having integral numbers of said processing stations and said idle stations sealed to a top wall thereof, conveying thereby a modularity to the construction of said substrate handling and processing system, whereby the total numbers of said processing stations and said idle stations may be conveniently selected or changed as desired, requiring further only corresponding changes in said horizontal transport means and the overall size of said system.

30. A substrate handling and processing system as in claim 6 wherein said load lock load/unload means includes doors for said entrance and exit load locks, and also includes external lift blades for transferring individual ones of said vertically oriented substrates from said entrance cassette to said entrance load lock door and for individually transferring said substrates from said exit load lock door to said exit cassette, said load lock doors having open and closed positions, said open positions allowing said substrates to be transferred between said load lock doors and said cassettes by means of said external lift blades, said closed positions allowing said substrates to be transferred between said load lock doors and said main chamber by means of said lift blades dedicated to said load locks, each of said load lock doors having affixed to an inner surface thereof a pair of receiving guides, each of said receiving guides having a vertically oriented groove, said receiving guides being spaced apart with said grooves facing one another to allow one of said substrates to be securely and slidably engaged by said receiving guides, each of said load lock doors having a lever arm rotatably attached to said inner surface, said lever arm having a grooved guide attached thereto, said lever arm being rotatable between a disengaged and an engaged position, said lever arm being positioned to allow said substrate while slidably engaged by said receiving guides to be further engaged by said grooved guide when said lever arm is in said engaged position, said lever arm being also positioned to allow said substrate to be raised into and lowered out of said receiving guides by means of said external lift blades and by means of said lift blades dedicated to said load locks when said lever arm is in said disengaged position, whereby vertically oriented individual ones of said substrates are securely transferred between said cassettes and said load locks.

31. A substrate handling and processing system as in claim 30 wherein the process of transferring one of said substrates from said entrance cassette to said dedicated lift blade of said entrance load lock and into said main chamber includes ten distinct steps, a first step being elevation of said lift blades from said main chamber to their raised positions, with said entrance load lock dedicated lift blade being empty, a second step being venting of said entrance load lock to atmosphere, a third step being movement of said entrance load lock door from said closed position to said open position, with said lever arm being in said disengaged position, a fourth step being elevation of said external lift blade of said entrance load lock through said entrance cassette, said external lift blade securely engaging one of said substrates and bringing said substrate into slidable engagement with said receiving guides, a fifth step being movement of said lever arm to said engaged position, whereby said substrate is engaged by said grooved guide and lifted above said external lift blade, a sixth step being retraction of said external lift blade through said entrance cassette, allowing said entrance cassette to be indexed forward in preparation for a next transfer cycle, a seventh step being return of said entrance load lock door to said closed position, an eighth step being evacuation of said entrance load lock, a ninth step being return of said lever arm to said disengaged position, thereby depositing said substrate onto said dedicated lift blade, and a tenth step being return of said lift blades to their lowered positions in said main chamber.

32. A substrate handling and processing system as in claim 30 wherein said load lock doors are rotatably attached to said load locks by means of vertically oriented hinges, with a 180° rotation about said hinges serving to move said load lock doors from said closed positions to said open positions, and conversely.

33. A system for handling and processing relatively thin workpieces, said system comprising a processing station having an opening therein and means for moving a workpiece vertically into said processing station, said moving means comprises means for supporting a workpiece thereon in vertical orientation and moving said workpiece thorugh said opening and holding the workpiece during processing, sealing means movable with said moving means to seal said opening when the workpiece is moved into said processing chamber through said opening, and said moving means being configured to engage only peripheral portions of the workpiece, whereby when the workpiece is moved into said processing chamber the workpiece can be processed on either or both of its vertical faces while supported on said moving means.

34. A system for handling and processing relatively thin, generally circular workpieces, said system comprising an elevated processing station, a lift blade below said processing station, said lift blade having an upper end with workpiece-engaging portions configured to engage peripheral areas of the workpiece adjacent the lower portion of the workpiece and support the workpiece in a substantially vertical position, said engaging portions having a width substantially less than the diameter of the intended workpiece, means for moving said lift blade vertically to and from said processing station, workpiece-supporting beam means for moving workpieces transversely of said lift blade, said beam means having spaced apart support means for holding the workpiece in substantially vertical position, and the distance between said spaced apart workpiece support means on said beam means being greater than the width of said engaging portions on said lift blade.

35. A system as claimed in claim 34 wherein said beam means comprises a further workpiece support means spaced from and between said spaced apart support means and said upper end of the lift blade is recessed between said workpiece-engaging portions to receive said further workpiece support means on said beam means.

36. A system as claimed in claim 34 comprising two said beam means spaced apart horizontally and at least one processing station and lift blade along each said beam means, and workpiece-transport means for moving a workpiece from said support means on one of said beam means to said support means on the other of said beam means.

37. A system as claimed in claim 36 wherein said transport means comprises a pivotally supported transport member having a workpiece-supporting structure spaced from the axis of said pivotal support for holding workpieces in a substantially vertical position, and means for pivoting said transport member to a position for receiving a workpiece from one of said beam means and further pivotal motion to deliver the received workpiece to the other of said beam means.

38. A system as claimed in claim 36 wherein said transport means comprises a transport member supported for horizontal translation along a straight-line path and having a workpiece-supporting structure thereon for holding workpieces in a substantially vertical position, and means for translating said transport member to a position for receiving a workpiece from one of said beam means and further translation to deliver the received workpiece to the other of said beam means.

39. A system for handling and processing workpieces, said system comprising a vacuum chamber for transporting workpieces therein, a plurality of processing chambers each having a sealable aperture opening into said transport vacuum chamber, vacuum lock chamber means for inserting workpieces into said transport chamber, said vacuum lock chamber means comprising a chamber having a first sealable opening to the exterior of said transport chamber and a second sealable opening to the interior of said transport chamber, means for moving a workpiece from said lock chamber through said second opening and into said transport chamber, transport means in said transport chamber for transporting workpieces to the various processing chambers and including means for inserting workpieces into said processing chambers, and said inserting means having sealing means movable therewith to seal said openings when a workpiece is moved therethrough into a respective processing chamber.

40. A system as claimed in claim 39 comprising vacuum pumping means connected to said processing chambers internally of said apertures, and valve means for disconnecting said pumping means from said processing chambers, whereby when said valve means to one of said processing chambers is closed and said inserting means is positioned to seal the aperture in said one processing chamber, said one processing chamber can be opened for servicing or replacing processing elements in said one processing chamber while preserving operating conditions in said transport chamber and the other of said processing chambers.

41. A system for handling and processing relatively thin workpieces, said system comprising a processing chamber having an opening therein and means for moving a workpiece vertically into said processing chamber through said opening, said moving means comprises means for supporting a workpiece thereon in vertical orientation and moving said workpiece through said opening and holding the workpiece during processing, said moving means being configured to engage peripheral portions of the workpiece above the bottom of the workpiece to hold the workpiece in vertical orientation, and said moving means being configured to engage only peripheral portions of the workpiece, whereby when the workpiece is moved into said processing chamber the workpiece can be processed on either or both of its vertical faces while supported on said moving means.

42. A system for handling and processing workpieces, said system comprising a vacuum chamber for transporting workpieces therein, at least one processing chamber having a sealable aperture opening into said transport vacuum chamber, vacuum lock chamber means, transport means in said transport chamber for transporting workpieces to said at least one processing chamber, means for moving workpieces from said lock chamber means to said transport means, said transport means including means for inserting workpieces into said at least one processing chamber, and said inserting means having sealing means movable therewith to seal said opening when a workpiece is moved therethrough into a said at least one processing chamber.

43. A system for handling and processing workpieces, said system comprising a vacuum chamber, at least one processing chamber having a sealable aperture opening into said vacuum chamber, means for transporting workpieces in said vacuum chamber, means for transferring workpieces from said transporting means and inserting such workpieces into said at least one processing chamber through said opening, and said transferring means having sealing means movable therewith to seal said opening when a workpiece is inserted therethrough.

* * * * *